United States Patent
Lopez Rodriguez et al.

(10) Patent No.: US 8,487,647 B2
(45) Date of Patent: Jul. 16, 2013

(54) CIRCUIT AND METHOD FOR DEGLITCHING AN INPUT SIGNAL

(75) Inventors: Juan Luis Lopez Rodriguez, Barcelona (ES); Marina Ferran Farres, Barcelona (ES); Pere Esterri Pedra, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/231,475

(22) Filed: Sep. 13, 2011

(65) Prior Publication Data

US 2013/0063177 A1    Mar. 14, 2013

(51) Int. Cl.
*H03K 17/18* (2006.01)
(52) U.S. Cl.
USPC ............ 326/22; 326/26; 326/46; 326/93
(58) Field of Classification Search
USPC .......................... 326/26–28, 46, 93
See application file for complete search history.

(56) References Cited

U.S. PATENT DOCUMENTS

| | | | | |
|---|---|---|---|---|
| 5,018,169 | A | * | 5/1991 | Wong et al. .............. 375/373 |
| 6,134,252 | A | * | 10/2000 | Aspacio et al. ............ 372/34 |
| 6,778,111 | B1 | * | 8/2004 | Zhu et al. ................. 341/134 |
| 7,224,212 | B2 | | 5/2007 | Tseng |
| 7,391,241 | B2 | * | 6/2008 | Rajasekhar et al. ......... 327/34 |
| 7,397,292 | B1 | | 7/2008 | Potanin |
| 7,409,659 | B2 | | 8/2008 | Chakraborty et al. |
| 7,557,643 | B2 | | 7/2009 | Jin et al. |
| 2006/0082391 | A1 | | 4/2006 | Hsu et al. |

* cited by examiner

*Primary Examiner* — Don Le (57) ABSTRACT

System and method for deglitching an input signal. An output signal may be delayed to generate a delayed signal, the delayed signal determining a guard time interval following a desired transition in the input signal, and a logic circuit is used to keep the output signal unchanged during the guard time interval, and to allow the output signal to equal the input signal outside the guard time interval, based on a value of the delayed signal.

12 Claims, 10 Drawing Sheets

CIRCUIT AND METHOD FOR DEGLITCHING AN INPUT SIGNAL

BACKGROUND OF THE INVENTION

A glitch is an undesired digital pulse that usually has a short duration. Glitches may be a result of a design problem in digital circuits such as application specific integrated circuits (ASICs). Such glitches may cause faults in the operation of digital systems. For example, a design problem may result in a glitch in a signal coming out of an ASIC. Another digital circuit may receive the signal with the glitch as an input. The glitch may be interpreted by the second digital circuit as a legitimate pulse and as a consequence, the second circuit may not function correctly.

Glitches are many times a result of improper design of digital circuits that receive asynchronous inputs. Such glitches typically occur immediately following a legitimate change in the signal, either following a falling edge or following a rising edge of that signal.

BRIEF DESCRIPTION OF THE DRAWINGS

Reference to the accompanying drawings is made in which:

FIG. 17 depicts waveform diagrams demonstrating the operation of the deglitch circuit of FIG. 16, according to an example of the present invention; and It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EXAMPLES

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although examples of the present invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

For clarity reasons, and unless explicitly stated otherwise, logical components such as logical gates and flip-flops are described throughout the application as ideal components neglecting various delays such as rise time, fall time, propagation delay etc. In typical applications, these time delays are negligible and have a negligible effect on the functionality of the presented examples of the invention.

Figure 1:
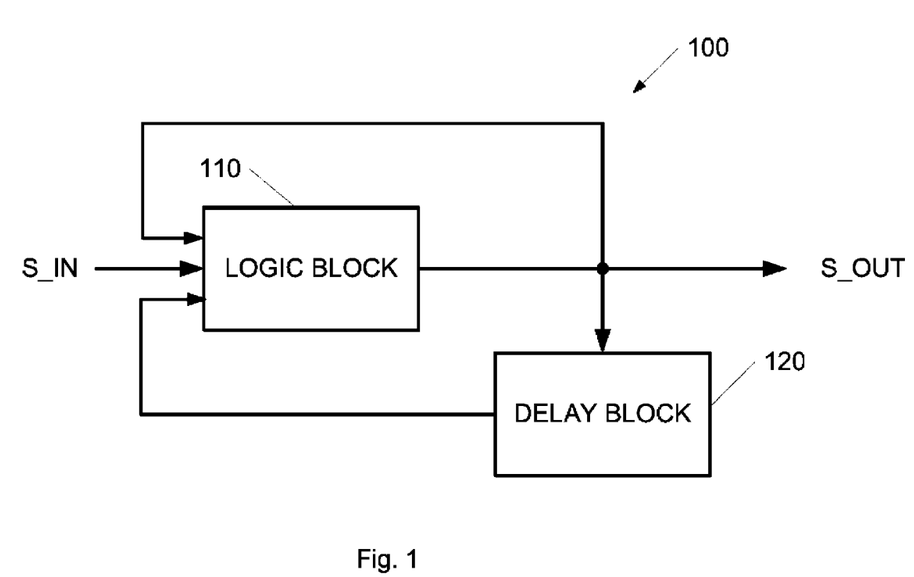
FIG. 1 is a schematic block diagram of a deglitch circuit 100 according to an example of the present invention.

Reference is now made to FIG. 1 depicting a schematic block diagram of a deglitch circuit 100 according to an example of the present invention. Deglitch circuit 100 may include a logic circuit 110 with delay block 120. Delay block 120 may delay an output signal to generate a delayed signal by a time interval denoted by $t_{delay}$. The delayed signal may determine a guard time interval following a desired transition in the input signal. Delay block 120 may include a low-pass filter (LPF) or a digital delay implemented using logic elements. For example, Delay block 120 may include a resistor-capacitor (RC) low pass filter including a resistor and a capacitor connected in series. In another example, delay block 120 may be implemented digitally by logic elements such as, but not limited to, counters, shift registers, or any other applicable logic element. Logic circuit 110 may keep the output signal unchanged during the guard time interval, and may allow the output signal to equal the input signal outside the guard time interval, based on a voltage level of the delayed signal. The guard time interval may be set to start after a desired transition in the input signal and end when no glitches are expected anymore but before a desired transition in the input signal is about to occur.

Figure 2:
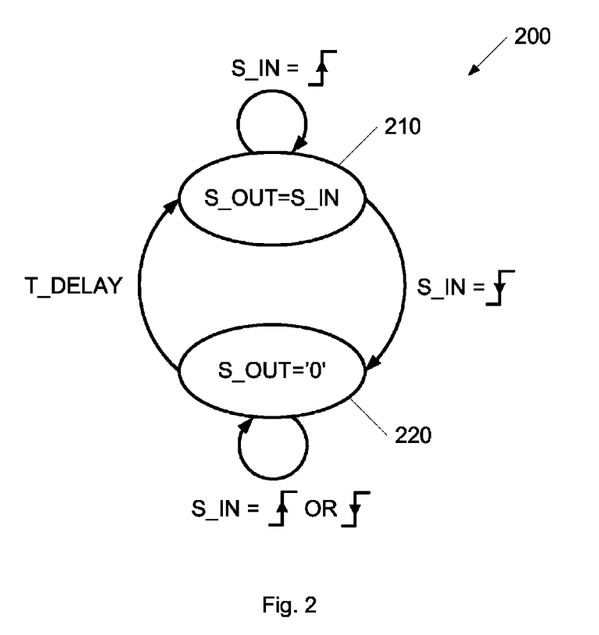
FIG. 2 is a state machine for filtering out glitches occurring within a guard time interval following a falling edge of the input signal, according an example of the present invention.

FIG. 2 illustrates a state machine 200 for filtering out glitches occurring within a guard time interval following a falling edge of the input signal, according to an example of the present invention. In state 210 the output signal may equal the input signal. Rising edges of the input signal may keep the state machine in state 210. A falling edge of the input signal may move the state machine to state 220. While in state 220, the output signal may equal logical '0' regardless of the input signal. After a delay time denoted $t_{delay}$ has elapsed, state machine 200 may move to state 210, and so forth. Thus the guard time interval may start following a falling edge of the input signal and end after $t_{delay}$. For example, elapsing of $t_{delay}$ may be indicated to state machine 200 by the delayed signal, e.g. by a rising edge, a falling edge or a change in logical value of the delayed signal.

Figure 3:
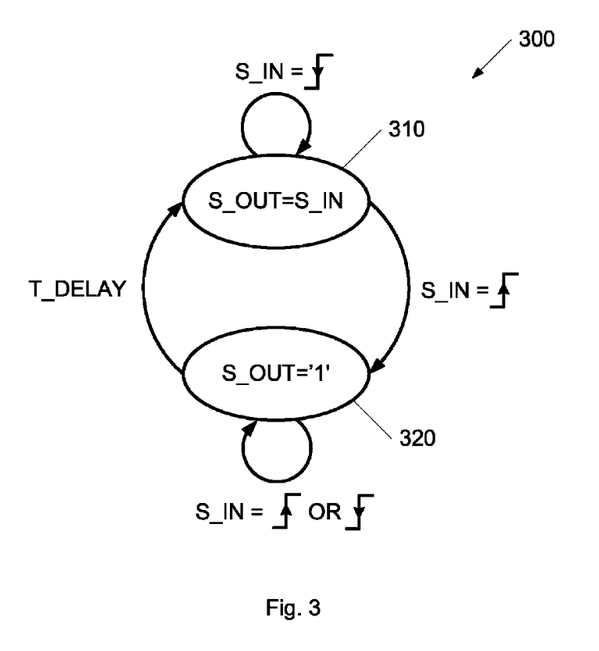
FIG. 3 is a state machine for filtering out glitches occurring within a guard time interval following a rising edge of the input signal, according to an example of the present invention.

FIG. 3 illustrates a state machine 300 for filtering out glitches occurring within a guard time interval following a rising edge of the input signal, according to an example of the present invention. In state 310 the output signal may equal the input signal. Falling edges of the input signal may keep the state machine in state 310. A rising edge of the input signal may move the state machine into state 320. While in state 320, the output signal may equal logical '1' regardless of the input signal. After a delay time denoted $t_{delay}$ has elapsed, state machine 300 may move to state 310, and so forth. Thus the guard time interval may start following a rising edge of the input signal and end after $t_{delay}$. For example, elapsing of $t_{delay}$ may be indicated to state machine 300 by the delayed signal, e.g. by a rising edge, a falling edge or a change in logical value of the delayed signal.

Figure 4:
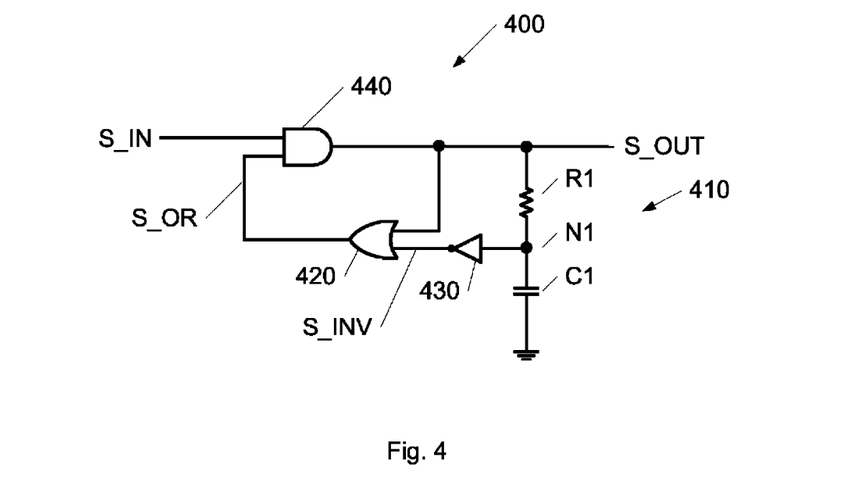
FIG. 4 is a deglitch circuit for filtering glitches occurring within a guard time interval following a falling edge of the input signal, according to an example of the present invention.

FIG. 4 illustrates a deglitch circuit 400 for filtering glitches occurring within a guard time interval following a falling edge of the input signal, according to an example of the present invention. Deglitch circuit 400 may implement, for example, state machine 200 (shown in FIG. 2) for filtering out glitches occurring within a guard time interval following a falling edge of the input signal.

Deglitch circuit 400 may include an RC low pass filter 410 including a resistor R1 and a capacitor C1 connected in series where resistor R1 may be connected in one terminal to the output signal $S_{out}$ present at the output of "and" gate 440, and in the other terminal to capacitor C1 at connection Node N1, and capacitor C1 may be connected at its second terminal to ground. RC low pass filter 410 may receive output signal $S_{out}$ and may provide voltage $V_c$ at an input of inverter 430. The output of inverter 430 may be coupled to a first input terminal of an "or" gate 420. A second input terminal of "or" gate 420 may receive output signal $S_{out}$. The output terminal of "or" gate 420 may be coupled to a first input terminal of "and" gate 440, thus providing a feedback loop. A second input terminal of "and" gate 440 may be receive input signal $S_{in}$.

In operation, RC low pass filter 410 may filter output signal $S_{out}$. The filtered signal $V_c$ present at the input of inverter 430 may be seen as a logical '0' if $V_c$ is lower than $V_{inL}$ of inverter 430, and as a logical '1' if $V_c$ is higher than $V_{inH}$ of inverter 430. $V_{inL}$ may relate to a voltage level below which a signal is interpreted as logical '0' by a digital component. $V_{inH}$ may relate to a voltage level above which a signal is interpreted as logical '1' by a digital component. To prevent an ambiguity between $V_{inL}$ and $V_{inH}$, inverter 430 may have a Schmitt-trigger input. Due to the time constant $t_{RC}$ of RC low pass filter 410 filtered signal $V_c$ may be seen at the input of inverter 430 as a signal following output signal $S_{out}$ and delayed by $t_{delay}$ with respect to output signal $S_{out}$. Inverter 430 may invert the logical values of $V_c$ to produce $S_{inv}$ at the output of inverter 430. According to the truth table of "or" gates, logical '0' at $S_{inv}$ may enable the first input of And gate 440 $S_{or}$ to equal output signal $S_{out}$, while logical '1' at $S_{inv}$ may force a logical '1' at $S_{or}$. According to the truth table of "and" gates, logical '1' at $S_{or}$ may enable output signal $S_{out}$ to equal input signal $S_{in}$, while logical '0' at $S_{or}$ may force a logical '0' at output signal $S_{out}$. Thus, in case of logical '0' at output signal $S_{out}$ and at $S_{inv}$, output signal $S_{out}$ may be latched at logical '0', regardless of the logical value of input signal $S_{in}$.

After a falling edge of input signal $S_{in}$ occurs, output signal $S_{out}$ may change from logical '1' to logical '0', capacitor C1 may gradually discharge, with the rate of discharging depending on time constant $t_{RC}$ of RC low pass filter 410. As long as $V_c$ is above $V_{inL}$ of inverter 430, $S_{inv}$ remains at logical '0', and since output signal $S_{out}$ also equals logical '0', $S_{or}$ may be set to logical '0', forcing logical '0' at output signal $S_{out}$ regardless of the value of input signal $S_{in}$. At some point $V_c$ may decrease below the level of $V_{inL}$ of inverter 430, $S_{inv}$ may change to logical '1', enabling output signal $S_{out}$ to equal input signal $S_{in}$. Thus, a legitimate rise in $S_{in}$ may cause a rise in $S_{out}$ as well. The time it takes $V_c$ to decrease below the level of $V_{inL}$ after the occurrence of a falling edge of output signal $S_{out}$, also referred to as $t_{delay}$, may substantially define the guard time interval in which $S_{out}$ is latched at logical '0', regardless of the value of input signal $S_{in}$, thus a glitch appearing at $S_{in}$ during the guard time interval is prevented from passing to output signal $S_{out}$ and is thus eliminated.

Outside the guard time interval $S_{or}$ may be set to logical '1', since either $S_{inv}$ or $S_{out}$ equal logical '1' and output signal $S_{out}$ may equal input signal $S_{in}$.

Values for C1 and R1 may be chosen such that:

$$R1 * C1 = \frac{-t_{delay}}{\ln\left(\frac{V_{inL}}{V_{c\_max}}\right)} \quad (1)$$

Where $V_{c\_max}$ denotes the maximal voltage of capacitor C1. For example, if $V_{c\_max}$=5V, $V_{inL}$=1V and $t_{delay}$=2 nS, then R1*C1=1.24*10$^{-3}$ and possible values for R1 and C1 may be R1=100 kΩ and C1=12.4 nF.

Figure 5:
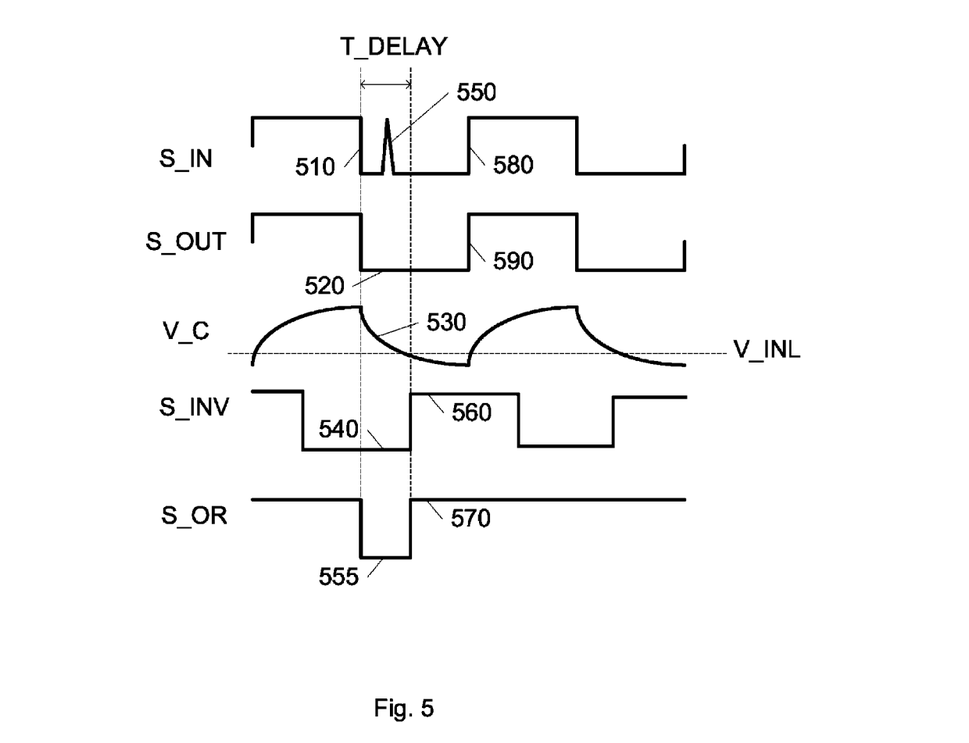
FIG. 5 is a waveform diagram demonstrating the operation of the deglitch circuit of FIG. 4.

Reference is now made to FIG. 5 depicting waveform diagrams demonstrating the operation of deglitch circuit 400 (see FIG. 4) according to an example of the present invention. FIG. 5 depicts waveform diagrams of input signal output signal $S_{out}$, the voltage level $V_c$ at node N1, signal $S_{inv}$ at the output of inverter 430, and signal $S_{or}$ at the output of Or gate 420. After a falling edge occurs at input signal $S_{in}$ 510, output signal $S_{out}$ may change to logical '0' 520 and voltage $V_c$ of capacitor C1 may gradually decrease 530 as C1 discharges. As long as $V_c$ is above $V_{inL}$ of inverter 430 $S_{inv}$ may remain at logical '0' 540, since $S_{out}$ may also equal logical '0' $S_{or}$ may equal logical '0' 555, and thus $S_{out}$ may be latched at logical '0', despite of a glitch 550 appearing at $S_{in}$. As $V_c$ decreases below $V_{inL}$ of Inverter 430 $S_{inv}$ may change to logical '1' 560. As a result, $S_{or}$ may also change to logical '1' 570, enabling output signal $S_{out}$ to equal input signal $S_{in}$. Hence, when a legitimate rise occurs $S_{in}$ 580, $S_{out}$ may rise as well 590.

Figure 6:
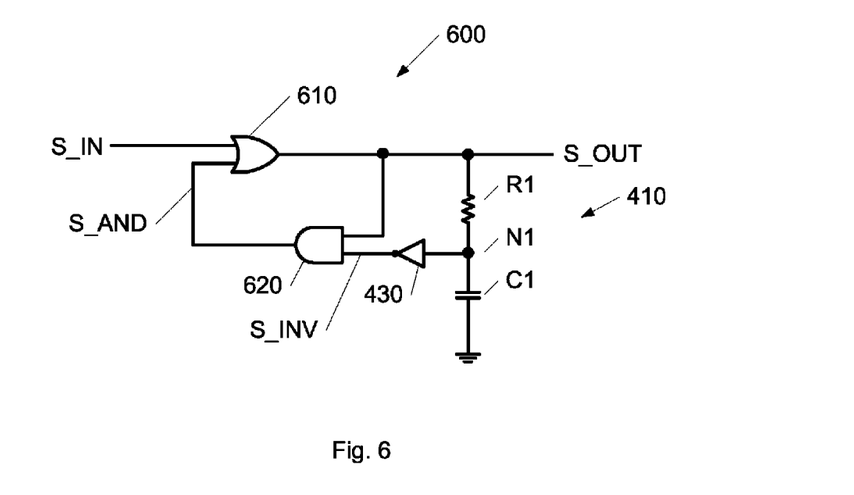
FIG. 6 is a deglitch circuit for filtering glitches occurring within a guard time interval following a rising edge of the input signal, according to an example of the present invention.

Reference is now made to FIG. 6 depicting a deglitch circuit 600 for filtering glitches occurring within a guard time interval following a rising edge of the input signal, according to an example of the present invention. Deglitch circuit 600 may include an RC low pass filter 410 including a resistor R1 and a capacitor C1 connected in series where resistor R1 may be connected at one terminal to the output signal $S_{out}$ present at the output of "or" gate 610, and at the other terminal to capacitor C1 about connection node N1, and capacitor C1 may be connected at its second terminal to the ground. RC low pass filter 410 may receive output signal $S_{out}$ and may provide voltage $V_c$ at an input of inverter 630. The output of inverter 630 may be coupled to a first input terminal of an "and" gate 620. A second input terminal of "and" gate 620 may receive output signal $S_{out}$. The output terminal of "and" gate 420 may be coupled to a first input terminal of "or" gate 610, thus providing a feedback loop. A second input terminal of "or" gate 610 may receive input signal $S_{in}$.

In operation, RC low pass filter 410 may filter output signal $S_{out}$. The filtered signal $V_c$ present at the input of inverter 630 may be seen as a logical '0' if $V_c$ is lower than $V_{inL}$ of inverter 630, and as a logical '1' if $V_c$ is higher than $V_{inH}$ of inverter 630. To prevent an umbiguity zone, inverter 630 may have a Schmitt-trigger input. Due to the time constant $t_{RC}$ of RC low pass filter 410, filtered signal $V_c$ may be seen at the input of inverter 630 as a signal following output signal $S_{out}$ and delayed by $t_{delay}$ with respect to output signal $S_{out}$. Inverter 630 may invert the logical values of $V_c$ to produce $S_{inv1}$ at the output of inverter 630. According to the truth table of "and" gates, logical '1' at $S_{inv1}$ may enable the first input of "or" gate 610, $S_{and1}$ to equal output signal $S_{out}$, while logical '0' at $S_{inv1}$ may force a logical '0' at $S_{and1}$. According to the truth table of "or" gates, logical '0' at $S_{and1}$ may enable output signal $S_{out}$ to equal input signal $S_{in}$, while logical '1' at $S_{and1}$ may force a logical '1' at output signal $S_{out}$. Thus, in case of logical '1' at output signal $S_{out}$ and at $S_{inv1}$, output signal $S_{out}$ is latched at logical '1', regardless of the logical value of input signal $S_{in}$.

After a rising edge of input signal $S_{in}$ occurs, output signal $S_{out}$ may change from logical '0' to logical '1', and capacitor C1 may gradually charge, with the rate of charging depending on time constant $t_{RC}$ of RC low pass filter 410. As long as $V_c$ is below $V_{inH}$ of inverter 630, $S_{inv1}$ remains at logical '1', and since output signal $S_{out}$ also equals logical '1', $S_{and1}$ may be set to logical '1', forcing logical '1' at output signal $S_{out}$ regardless of the value of input signal $S_{in}$. At some point $V_c$ may increase above the level of $V_{inH}$ of inverter 630, $S_{inv1}$ may change to logical '0', enabling output signal $S_{out}$ to equal input signal $S_{in}$. Thus, a legitimate fall in $S_{in}$ may cause a fall in $S_{out}$ as well. The time it takes $V_c$ to increase above the level of $V_{inH}$ after a rising edge of output signal $S_{out}$ occurs, may substantially define the guard time interval in which $S_{out}$ is latched at logical '1', regardless of the value of input signal $S_{in}$. Thus glitches appearing at $S_{in}$ during the guard time interval are prevented from passing to output signal $S_{out}$ and therefore removed. Outside the guard time interval $S_{and1}$ may be set to logical '0', since either $S_{inv1}$ or $S_{out}$ equal logical '0' and output signal $S_{out}$ may equal input signal $S_{in}$.

Values for C1 and R1 may be chosen such that:

$$R1 * C1 = \frac{-t_{delay}}{\ln\left(\frac{V_{inH}}{V_{c\_max}}\right)} \quad (1)$$

Where $V_{c\_max}$ denotes the maximal voltage of capacitor C1. For example, if $V_{c\_max}$=5V, $V_{inH}$=3.5V and $t_{delay}$=2 nS, then R1*C1=1.66*10$^{-3}$ and possible values for R1 and C1 may be R1=100 kΩ and C1=16.6 nF.

Figure 7:
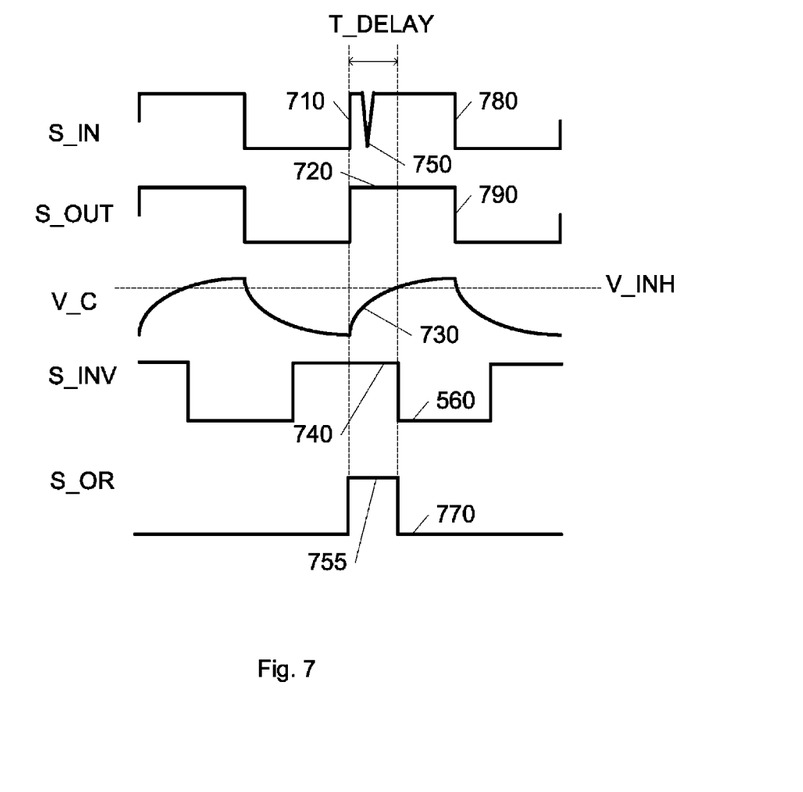
FIG. 7 is a waveform diagram demonstrating the operation of the deglitch circuit of FIG. 6.

Reference is now made to FIG. 7 depicting waveform diagrams demonstrating the operation of deglitch circuit 600 (shown in FIG. 6) according to an example of the present invention. FIG. 7 depicts waveforms of input signal $S_{in}$, output signal $S_{out}$, the voltage level $V_c$ at node N1, signal $S_{inv1}$ at the output of inverter 630, and signal $S_{and1}$ at the output of And gate 620. After a rising edge at input signal $S_{in}$ 710 occurs, output signal $S_{out}$ may change to logical '1' 720 and voltage $V_c$ of capacitor C1 may gradually increase 730 as C1 charges. As long as $V_c$ is below $V_{inH}$ of inverter 630 $S_{inv1}$ may remain at logical '1' 740, since $S_{out}$ may also equal logical '1' $S_{and1}$ may equal logical '1' 755. Thus $S_{out}$ may be latched at logical '1' 720, despite of a glitch 750 appearing at $S_{in}$. As $V_c$ increases above $V_{inH}$ of Inverter 630 $S_{inv1}$ may change to logical '0' 760. As a result, $S_{and1}$ may also change to logical '1' 770, enabling output signal $S_{out}$ to equal input signal $S_{in}$. Hence, when a legitimate fall appears in $S_{in}$ 780, $S_{out}$ may rise as well 790.

It should be readily understood by these skilled in the art that deglitch circuits 400 (FIG. 4) and 600 (FIG. 6) are only one possible implementation of state machines 200 ((FIG. 2) and 300 (FIG. 3) respectively. State machines 200 and 300 may also be realized by various other analogous circuits comprising, for example, combinatorial logic, other flip flops and latches. For example, De-Morgan's laws may be applied to convert Deglitch circuits 400 and 600 to other logical gates, such as, for example, "Nand" gates.

Figure 8:
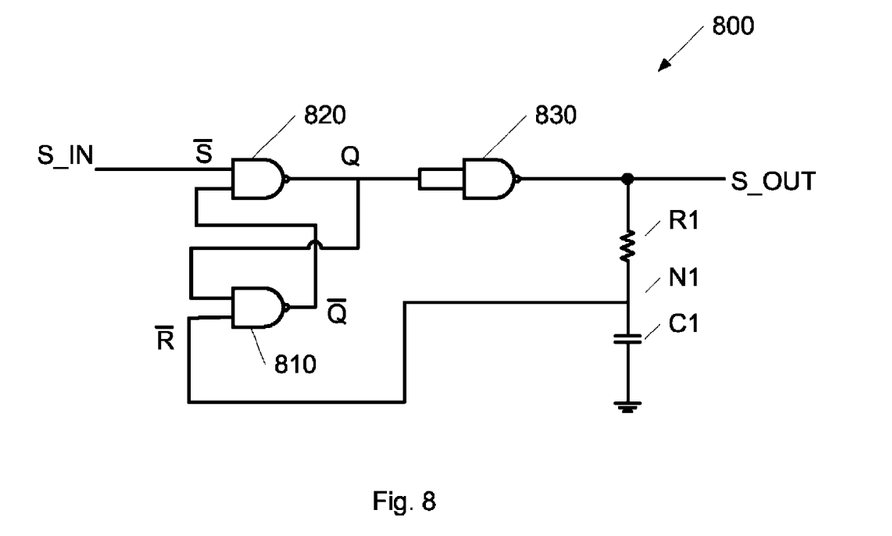
FIG. 8 is another deglitch circuit for filtering glitches occurring within a guard time interval following a falling edge of the input signal, according to an example of the present invention.

Reference is now made to FIG. 8 depicting a deglitch circuit 800 for filtering glitches occurring within a guard time interval following a falling edge of the input signal, according to an example of the present invention. Deglitch circuit 800 may be analogous to deglitch circuit 400 and may implement, for example, state machine 200 for filtering out glitches occurring within a guard time interval following a falling edge of the input signal.

Deglitch circuit 800 may include an RC low pass filter 410 including a resistor R1 and a capacitor C1 connected in series, where resistor R1 may be connected at one terminal to the output signal $S_{out}$ present at the output of "Nand" gate 830, and at the other terminal to capacitor C1 at connection node N1, and capacitor C1 may be connected at its second terminal to ground. RC low pass filter 410 may receive output signal $S_{out}$ and may provide voltage $V_c$ at an input of "Nand" gate 810. The output of "Nand" gate 810, denoted $\overline{Q}$, may be coupled to a first input terminal of "Nand" gate 820, thus providing a feedback loop. A second input terminal of "Nand" gate 810 may receive output signal Q of "Nand" gate 820. The output terminal $\overline{Q}$ of "Nand" gate 810 may be coupled to a first input terminal of "Nand" gate 820. A second input terminal of "Nand" gate 820 may receive input signal $S_{in}$. Both input terminals of "Nand" gate 830 may be coupled to output signal Q of "Nand" gate 820, thus "Nand" gate 830 may function as an inverter inverting Q to produce $S_{out}$.

In operation, RC low pass filter 410 may filter output signal $S_{out}$. The filtered signal $V_c$ present at the input of "Nand" gate 810 may be seen as a logical '0' if $V_c$ is lower than $V_{inL}$ of "Nand" gate 810, and as a logical '1' if $V_c$ is higher than $V_{inH}$ of "Nand" gate 810. To prevent an ambiguity, "Nand" gate 810 may have a Schmitt-trigger trigger input. Due to the time constant $t_{RC}$ of RC low pass filter 410, filtered signal $V_c$ may be seen at the input of Nand gate 810 as a signal following output signal $S_{out}$ and delayed by $t_{delay}$ with respect to output signal $S_{out}$. Connected as shown in FIG. 8 "Nand" gates 810 and 820 may form an active low set-reset ($\overline{SR}$) latch, with $S_{in}$ coupled to the set $\overline{S}$ input of the $\overline{SR}$ latch and $V_c$ coupled to the reset $\overline{R}$ input of the $\overline{SR}$ latch. The truth table of the $\overline{SR}$ latch is presented below:

TABLE 1 truth table of an $\overline{SR}$ latch

| $\overline{S}$ | $\overline{R}$ | Q | $\overline{Q}$ |
|---|---|---|---|
| 0 | 0 | 1 | 1 |
| 0 | 1 | 1 | 0 |
| 1 | 0 | 0 | 1 |
| 1 | 1 | No Change | No Change |

Figure 9:
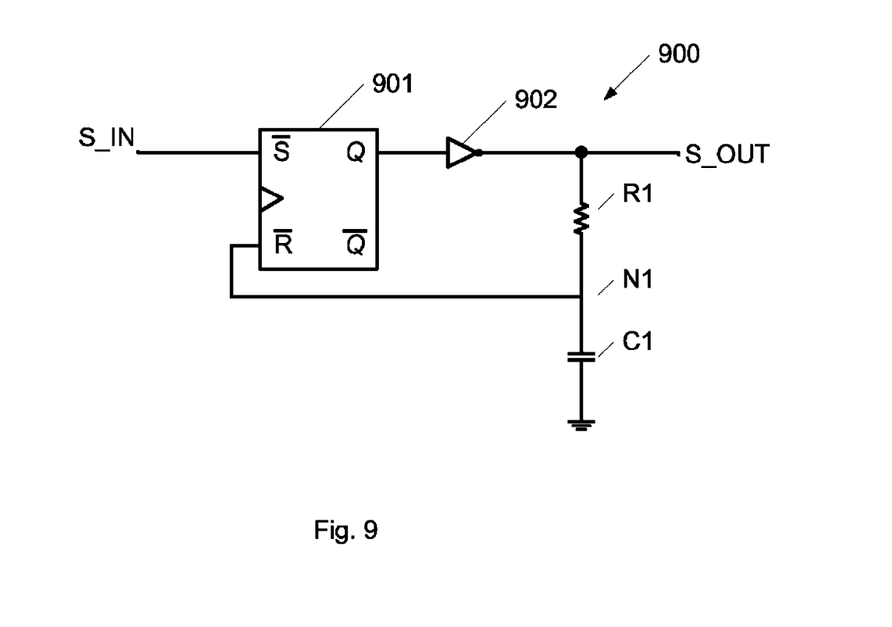
FIG. 9 is another deglitch circuit for filtering glitches occurring within a guard time interval following a falling edge of the input signal, according to an example of the present invention

Reference is now made to FIG. 9 depicting another deglitch circuit 900 for filtering glitches occurring within a guard time interval following a falling edge of the input signal, according to an example of the present invention. Deglitch circuit 900 may be analogous to deglitch circuit 800 and may implement state machine 200 for filtering out glitches occurring within a guard time interval following the occurrence of a falling edge of the input signal. In deglitch circuit 900, an $\overline{SR}$ latch 901 may replace "Nand" gates 810 and 820 and inverter 902 may replace "Nand" gate 830. Hence, $\overline{SR}$ latch 901 may receive the delayed signal present at node N1 at the reset ($\overline{R}$) input and the input signal $S_{in}$ at the set ($\overline{S}$) input. Inverter 902 may receive the Q output of the $\overline{SR}$ latch. Output signal $S_{out}$ may be the output of inverter 902.

Figure 10:
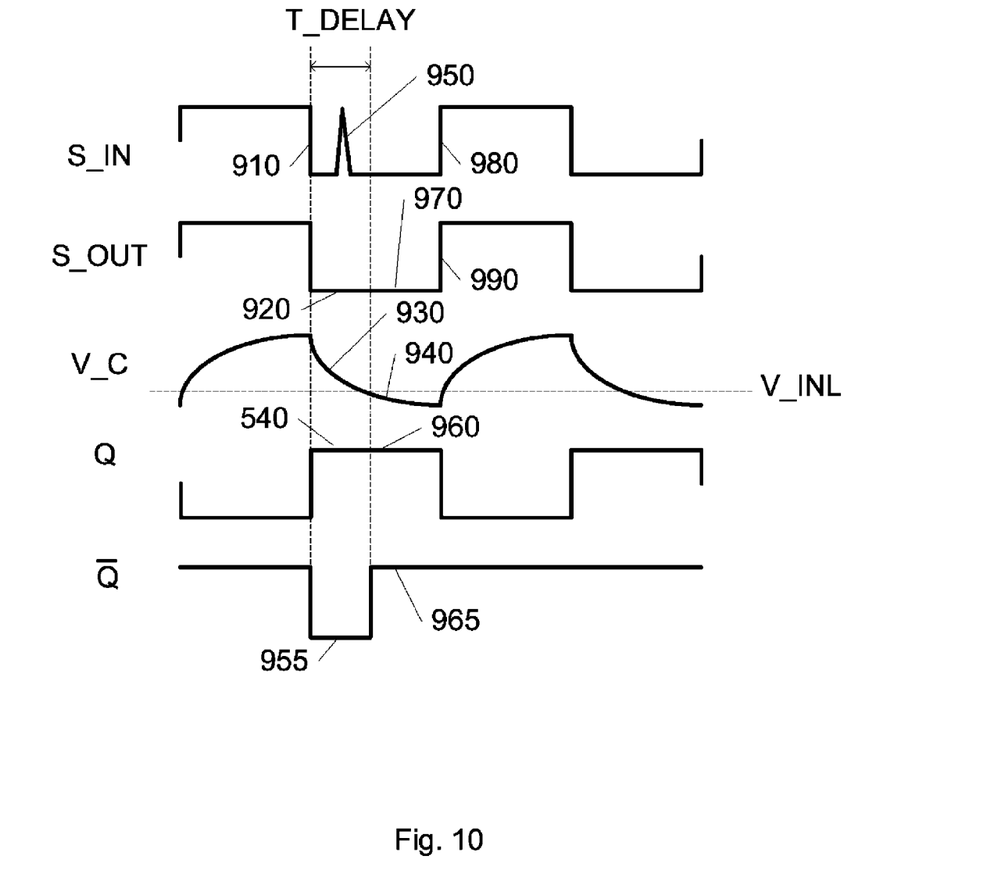
FIG. 10 is a waveform diagram demonstrating the operation of the deglitch circuits of FIGS. 8 and 9.

Reference is now made to FIG. 10 depicting waveform diagrams demonstrating the operation of deglitch circuits 800 and 900 according to an example of the present invention. FIG. 10 depicts waveform diagrams of input signal $S_{in}$, output signal $S_{out}$, the voltage level $V_c$ at node N1, and signals Q and $\overline{Q}$ of deglitch circuits 800 and 900 according to an example of the present invention. After a falling edge at input signal $S_{in}$ occurs 910, $\overline{Q}$ may change to logical '0' 955, Q may change to logical '1' 915 and output signal $S_{out}$ may change to logical '0' 920, by "Nand" gate 830 in the example presented in FIG. 8 or by inverter 902 in the example presented in FIG. 9. Voltage $V_c$ of capacitor C1 may gradually decrease 930 as C1 discharges. As long as $V_c$ is above $V_{inL}$ of "Nand" gate 810 or of $\overline{SR}$ latch 901, $\overline{R}$ may be seen as a logical '1', and thus Q may be latched at logical '1'. Since $\overline{Q}$ may equal logical '0' 955, a rise in $\overline{S}$ may leave Q unchanged, and thus Q and output signal $S_{out}$ may not change despite of a glitch 950 appearing at $S_{in}$. As $V_c$ decreases 940 below $V_{inL}$ of Nand gate 810 or of $\overline{SR}$ latch 901, $\overline{R}$ may be seen as a logical '0'. As a result, $\overline{Q}$ may equal logical '1' 965, Q may equal not($S_{in}$) 960, and output signal $S_{out}$ may equal input signal $S_{in}$ 970. Hence, when a legitimate rise appears $S_{in}$ 980, $S_{out}$ may rise as well 990. During the time interval after $V_c$ decreases 940 below $V_{inL}$ of Nand gate 810 and before a legitimate rise appears in $S_{in}$ 980, both $\overline{R}$ and $\overline{S}$ signals may equal logical '0'. In this case both Q and $\overline{Q}$ may equal logical '1' 960 and 965. The state of $\overline{S}=\overline{R}=$logical '0' is typically considered as invalid or restricted state. This is because if $\overline{S}$ and $\overline{R}$ will change substantially simultaneously to logical '1' the value of Q and $\overline{Q}$ may not be predictable. This race situation may be prevented according to an example of the present invention since when input signal $S_{in}$ changes from logical '0' to logical '1', capacitor C1 gradually charges and R moves from logical '0' to logical '1' only after $t_{delay}$.

Figure 11:
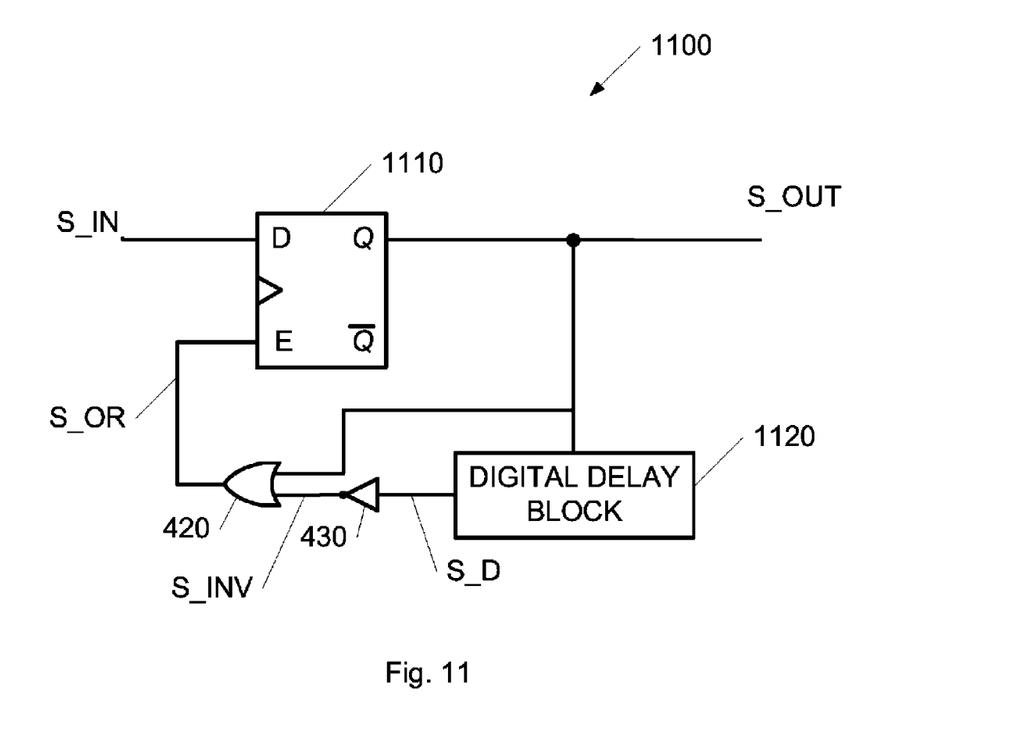
FIG. 11 depicts another digital deglitch circuit for filtering glitches occurring within a guard time interval following a falling edge of the input signal, according to an example of the present invention.

Reference is now made to FIG. 11 depicting a digital deglitch circuit 1100 for filtering glitches occurring within a guard time interval following a falling edge of the input signal, according to an example of the present invention. Deglitch circuit 1100 may include, for example, state machine 200 for filtering out glitches occurring within a guard time interval following a falling edge of the input signal. Deglitch circuit 1100 may be analogous to deglitch circuits 400. Specifically, RC low pass filter 410 of deglitch circuits 400 may be replaced with digital delay block 1120 and "and" gate 440 may be replaced with gated data (D) latch 1110 (also known as transparent latch, data latch, or gated latch). The truth table of a gated D latch is presented below:

TABLE 2 truth table of a gated D latch

| E | D | Q | $\overline{Q}$ |
|---|---|---|---|
| 0 | X | No Change | No Change |
| 1 | 0 | 0 | 0 |
| 1 | 1 | 1 | 1 |

Deglitch circuit 1100 may include a digital delay block 1120 coupled to output signal $S_{out}$ for delaying output signal $S_{out}$. Digital delay block 1120 may receive output signal $S_{out}$ and may provide delayed signal $S_d$, delayed by $t_{delay}$ with reference to output signal $S_{out}$, at an input of inverter 430. The output of inverter 430 $S_{inv}$ may be coupled to a first input terminal of an "or" gate 420. A second input terminal of "or" gate 420 may receive output signal $S_{out}$. Enable (E) input of gated D latch 1110 may be coupled to the output of "or" gate 420, $S_{or}$, while the D input of gated D latch 1110 may be coupled to the input signal $S_{in}$. Output signal $S_{out}$ may be the Q output of gated D latch 1110.

Similarly to deglitch circuit 400, $S_{or}$ may equal logical '1' if output signal $S_{out}$ or $S_{in}$ equal logical '1', thus enabling output signal $S_{out}$ to equal input signal $S_{in}$. $S_{or}$ may equal logical '0' for a $t_{delay}$ time period after a falling edge in the input signal occurs, which defines the guard time interval, in which $S_{out}$ remains not changed, i.e., at logical '0', filtering out any glitches that may appear at input signal $S_{in}$.

Figure 12:
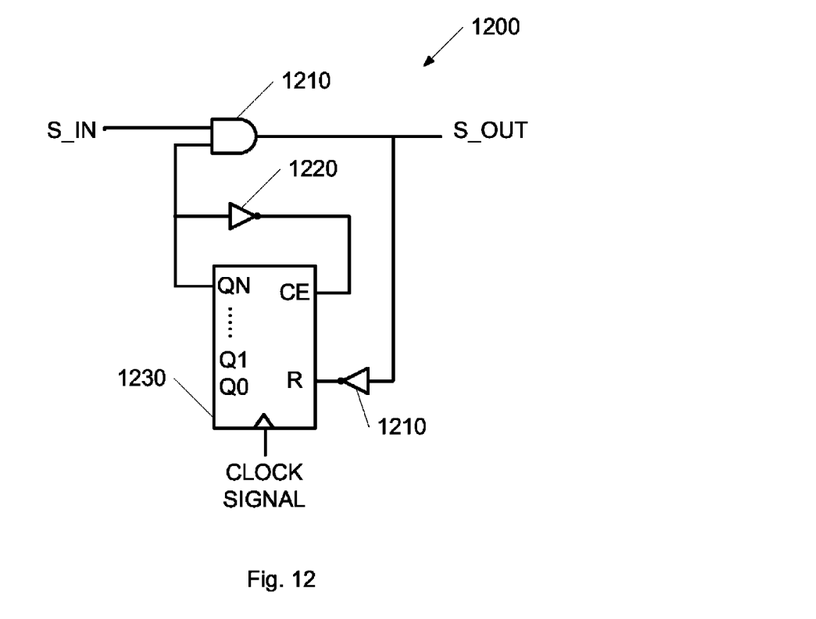
FIG. 12 depicts another digital deglitch circuit for filtering glitches occurring within a guard time interval following a falling edge of the input signal, according to an example of the present invention.

Reference is now made to FIG. 12 depicting a digital deglitch circuit 1200 for filtering glitches occurring within a guard time interval following a falling edge of the input signal, according to an example of the present invention. Deglitch circuit 1200 may implement, for example, state machine 200 for filtering out glitches occurring within a guard time interval following a falling edge of the input signal. Deglitch circuit 1200 may be analogous to deglitch circuits 400. Specifically, RC low pass filter 410 of deglitch circuits 400 may be replaced with digital delay block including counter 1230 and inverters 1220 and 1210. An N'th order bit of the counter, QN, may be coupled to a first input terminal of "and" gate 1210, and to the enable (CE) input of counter 1230, through inverter 1220. It should be readily understood by those skilled in the art that inverters 1220 and 1210 may be optional. For example, inverters 1220 and 1210 may not be necessary in case the enable and reset inputs of counter 1230 are active low. Counter 1230 may also receive a clock signal. $t_{delay}$ may be related to the frequency of the clock signal and to the order N of the counter bit coupled to the first input terminal of "and" gate 1210, and to the CE bit of counter 1230. The clock signal may be synchronous or asynchronous with input signal $S_{in}$.

During operation a falling edge of $S_{out}$ may reset counter 1230 to an initial value, for example, all outputs Q0 to QN of counter 1230 may equal logical '0'. Counter 1230 may be enabled to count as long as the QN bit of counter 1230 remains in the initial value, for example, as long as the QN bit of counter 1230 equals logical '0'. As counting continues the QN bit of counter 1230 may change its value, for example from logical '0' to logical '1' and counting may be stopped. Counter 1230 may be reset and enabled again with the next falling edge of $S_{out}$ and so forth. According to the example presented in FIG. 12, as long as QN bit of counter 1230 equals logical '1' $S_{out}$ may equal $S_{in}$, and while QN equals logical '0' $S_{out}$ may equal logical '0', filtering out any glitches hat may appear at $S_{in}$.

It should be noted that FIGS. 11 and 12 preset only two possible examples for digital implementations of the present invention, out of many other possible implementations, and that examples of the present invention are not limited to these specific examples. For example, deglitch circuits 1100 and 1200 may be modified to filter out glitches occurring following a rising edge of input signal $S_{in}$. In addition, delay block 120 and logic block 110 may be implemented using other logic components or functions. For example, delay block 120 may be implemented as a shift register, "and" gate 1210 may be interchangeable with gated D latch 1110 (see FIG. 11), components may be active high or active low with the required adjustments, etc. For example, in case gated D latch 1110 is used instead of "and" gate 1210, "and" gate 1110 may receive the N'th order bit of counter 1230 and the input signal $S_{in}$, and the output signal $S_{out}$ may be the output of the "and" gate. Likewise, digital delay block 1120 may be interchangeable with RC low pass filter 410 according to an example of the present invention.

Figure 13:
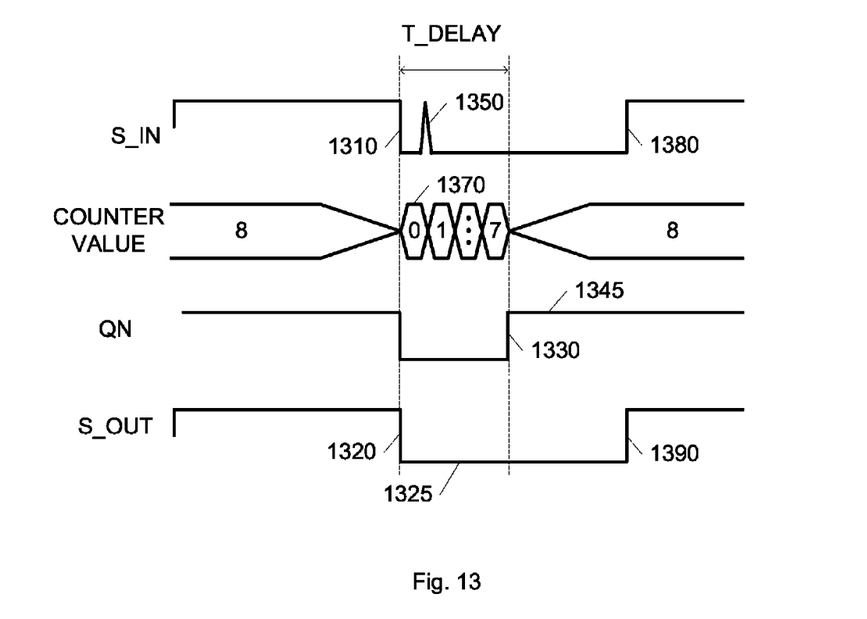
FIG. 13 depicts waveform diagrams demonstrating the operation of the deglitch circuit of FIG. 12 according to an example of the present invention.

Reference is now made to FIG. 13 depicting waveform diagrams demonstrating the operation of deglitch circuit 1200 (see FIG. 12) according to an example of the present invention. FIG. 13 depicts waveform diagrams of input signal $S_{in}$, output signal $S_{out}$ N'th order bit of the counter, QN, and the counter value. After a falling edge 1310 of input signal $S_{in}$ occurs, output signal $S_{out}$ may change from logical '1' to logical '0' 1320, counter 1230 may receive a reset signal and the outputs of counter 1230 Q0-QN may all be set to logical '0' forcing logical '0' at output signal $S_{out}$ 1025. As long as N'th order bit of counter 1230, QN, remains logical '0', output signal $S_{out}$ may equal logical '0' 1325 regardless of the value of input signal $S_{in}$. Thus a glitch 1350 appearing at input signal $S_{in}$ during that time period may be filtered out and not be present at output signal $S_{out}$. In addition As long as N'th order bit of the counter, QN, remains logical '0', counter 1230 may be enabled and may continue counting 1370 until the N'th order bit of counter 1230, QN, changes to logical '1'. When the N'th order bit of counter 1230, QN, equals logical '1' 1345, output signal $S_{out}$ may equal input signal $S_{in}$. Thus, a legitimate rise in $S_{in}$ 1380 may cause a rise in $S_{out}$ as well 1390. The time it takes the N'th order bit of counter 1230, QN, to change to logical '1' after the occurrence of a falling edge of output signal $S_{out}$, also referred to as $t_{delay}$, may substantially define the guard time interval in which $S_{out}$ may be latched at logical '0', regardless of the value of input signal $S_{in}$, thus a glitch appearing at $S_{in}$ during the guard time interval may be prevented from passing to output signal $S_{out}$ and may thus be eliminated.

Digital implementations of examples of the present invention may have the advantage of being fully incorporated inside a digital chip such as an FPGA or ASIC without adding any other components to the circuit. For example, if glitches in one of the inputs of an FPGA are discovered after the PCB is manufactured; the glitches may be filtered internally, within the FPGA, by adding the required logic functions, without adding any components to the circuit, which may be problematic at this point.

Figure 14:
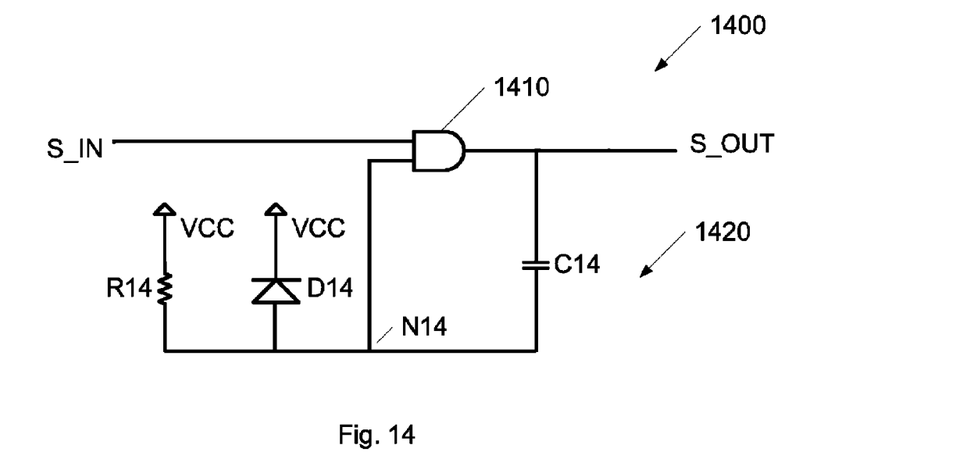
FIG. 14 illustrates another deglitch circuit for filtering glitches occurring within a guard time interval following a falling edge of the input signal, according to an example of the present invention.

FIG. 14 illustrates a deglitch circuit 1400 for filtering glitches occurring within a guard time interval following a falling edge of the input signal, according to an example of the present invention. Deglitch circuit 1400 may implement, for example, state machine 200 (shown in FIG. 2) for filtering out glitches occurring within a guard time interval following a falling edge of the input signal.

Deglitch circuit 1400 may include an RC low pass filter 1420 including a resistor R14 and a capacitor C14 connected in series, where resistor R14 may be coupled in one terminal to voltage source VCC, and in the other terminal to capacitor C14 and Diode D14 at connection Node N14. Capacitor C14 may be coupled at its second terminal to the output signal $S_{out}$ present at the output of "and" gate 1410. RC low pass filter 1420 may receive output signal $S_{out}$ and may provide voltage V_N14 at an input of "and" gate 1410. A second terminal of Diode D14 may be coupled to voltage source VCC. A second input terminal of "and" gate 1410 may receive input signal $S_{in}$. Diode D14 may enable quick discharge of capacitor C14 and may prevent over voltages from "a"nd gate 1410.

In operation, RC low pass filter 1420 may filter output signal $S_{out}$ while $S_{out}$ voltage level is lower than the voltage level of voltage source VCC, e.g. in case output signal $S_{out}$ equals logical '0'. In case output signal $S_{out}$ substantially equals the voltage level of voltage source VCC, e.g. when output signal $S_{out}$ equals logical '1', diode D14 may short capacitor C14 to voltage source VCC. Due to the time constant $t_{RC}$ of RC low pass filter 1420 filtered signal V_N14 may be seen at the input of "and" gate 1410 as an inverted signal following output signal $S_{out}$ and delayed by $t_{delay}$ with respect to output signal $S_{out}$, during the time in which output signal $S_{out}$ equals logical '0'. Signal V_N14 present at the input of "and" gate 1410 may be seen as a logical '0' if V_N14 is lower than $V_{inL}$ of "and" gate 1410, and as a logical '1' if V_N14 is higher than $V_{inH}$ of "and" gate 1410. To prevent an ambiguity between $V_{inL}$ and $V_{inH}$, "and" gate 1410 may have a Schmitt-trigger input. While V_N14 equals logical '1' output signal $S_{out}$ may equal input signal $S_{in}$. However, for a $t_{delay}$ time interval following a falling edge in output signal $S_{out}$, V_N14 may equal logical '0' and thus output signal $S_{out}$ may equal logical '0' regardless of input signal $S_{in}$. Thus, during this time period, glitches appearing in $S_{in}$ may be filtered out. Thus $t_{delay}$ which may be determined substantially by the time constant of RC low pass filter 1420 and $V_{inH}$ of "and" gate 1410, may define the guard time interval after a falling edge in input signal $S_{in}$, in which glitches may be filtered out.

Figure 15:
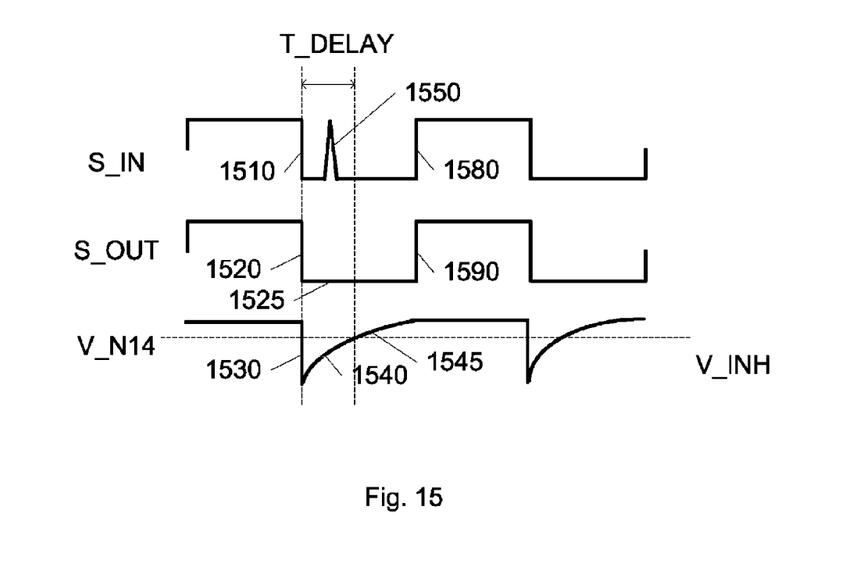
FIG. 15 depicts waveform diagrams demonstrating the operation of the deglitch circuit of FIG. 1, according to an example of the present invention.

Reference is now made to FIG. 15 depicting waveform diagrams demonstrating the operation of deglitch circuit 1400 (see FIG. 14) according to an example of the present invention. FIG. 15 depicts waveform diagrams of input signal $S_{in}$, output signal $S_{out}$ and the voltage level V_N14 at node N14. After a falling edge 1510 of input signal $S_{in}$ occurs, output signal $S_{out}$ may change from logical '1' to logical '0' 1520, capacitor C1 may quickly discharge 1530 through diode D14 and than gradually charge 1540, with the rate of charging depending on time constant $t_{RC}$ of RC low pass filter 1420. As long as V_N14 is below 1540 $V_{inL}$ of "and" gate 1410, V_N14 may be seen as logical '0', forcing logical '0' at output signal $S_{out}$ 1525 regardless of the value of input signal $S_{in}$. Thus a glitch 1550 appearing at input signal $S_{in}$ during that time period may be filtered out and not be present at output signal $S_{out}$. At some point in time, V_N14 may increase above the level of $V_{inH}$ of "and" gate 1410, and thus V_N14 may be seen as a logical '1' 1545, enabling output signal $S_{out}$ to equal input signal $S_{in}$. Thus, a legitimate rise in $S_{in}$ 1580 may cause a rise in $S_{out}$ as well 1590. The time it takes V_N14 to increase above the level of $V_{inH}$ after the occurrence of a falling edge of output signal $S_{out}$, also referred to as $t_{delay}$, may substantially define the guard time interval in which $S_{out}$ may be latched at logical '0', regardless of the value of input signal $S_{in}$, thus a glitch appearing at $S_{in}$ during the guard time interval may be prevented from passing to output signal $S_{out}$ and may thus be eliminated.

Figure 16:
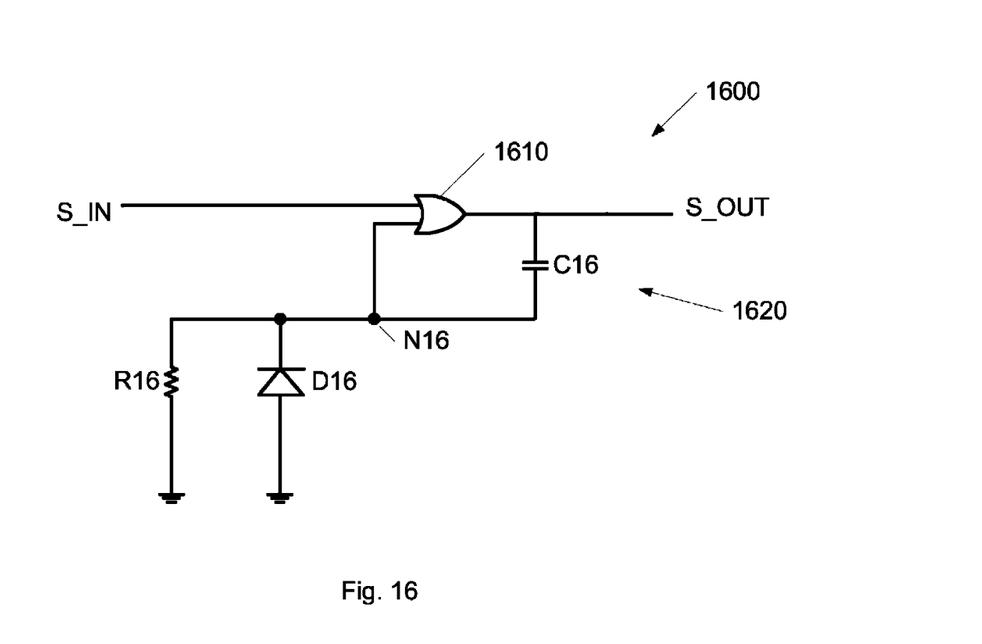
FIG. 16 illustrates another deglitch circuit for filtering glitches occurring within a guard time interval following a rising edge of the input signal, according to an example of the present invention.

FIG. 16 illustrates a deglitch circuit 1600 for filtering glitches occurring within a guard time interval following a rising edge of the input signal, according to an example of the present invention. Deglitch circuit 1600 may implement, for example, state machine 300 (shown in FIG. 3) for filtering out glitches occurring within a guard time interval following a rising edge of the input signal.

Deglitch circuit 1600 may include an RC low pass filter 1620 including a resistor R16 and a capacitor C16 connected in series, where resistor R16 may be coupled in one terminal to ground, and in the other terminal to capacitor C16 and Diode D16 at connection Node N16. Capacitor C16 may be coupled at its second terminal to the output signal $S_{out}$ present at the output of "or" gate 1610. RC low pass filter 1620 may receive output signal $S_{out}$ and may provide voltage V_N16 at an input of "or" gate 1610. A second terminal of Diode D16 may be coupled to ground. A second input terminal of "or" gate 1610 may receive input signal $S_{in}$. Diode D16 may enable quick charging of capacitor C16 and may prevent over voltages from "or" gate 1610.

In operation, RC low pass filter 1620 may filter output signal $S_{out}$ while $S_{out}$ voltage level is higher than the voltage level of ground, e.g. in case output signal $S_{out}$ equals logical '1'. In case output signal $S_{out}$ substantially equals the voltage level of ground, e.g. when output signal $S_{out}$ equals logical '0', diode D16 may short capacitor C16 to ground. Due to the time constant $t_{RC}$ of RC low pass filter 1620 filtered signal V_N16 may be seen at the input of "or" gate 1610 as an inverted signal following output signal $S_{out}$ and delayed by $t_{delay}$ with respect to output signal $S_{out}$, during the time in which output signal $S_{out}$ equals logical '1'. Signal V_N16 present at the input of "or" gate 1610 may be seen as a logical '0' if V_N16 is lower than $V_{inL}$ of "or" gate 1610, and as a logical '1' if V_N16 is higher than $V_{inH}$ of "or" gate 1610. To prevent an ambiguity between $V_{inL}$ and $V_{inH}$, "or" gate 1610 may have a Schmitt-trigger input. While V_N16 equals logical '0' output signal $S_{out}$ may equal input signal $S_{in}$. However, for a $t_{delay}$ time interval following a rising edge in output signal $S_{out}$, V_N16 may equal logical '1' and thus output signal $S_{out}$ may equal logical '1' regardless of input signal $S_{in}$. Thus, during this time period, glitches appearing in $S_{in}$ may be filtered out. Thus $t_{delay}$ which may be determined substantially by the time constant of RC low pass filter 1620 and $V_{inL}$ of "or" gate 1610, may define the guard time interval after a rising edge in input signal $S_{in}$, in which glitches may be filtered out.

Figure 17:
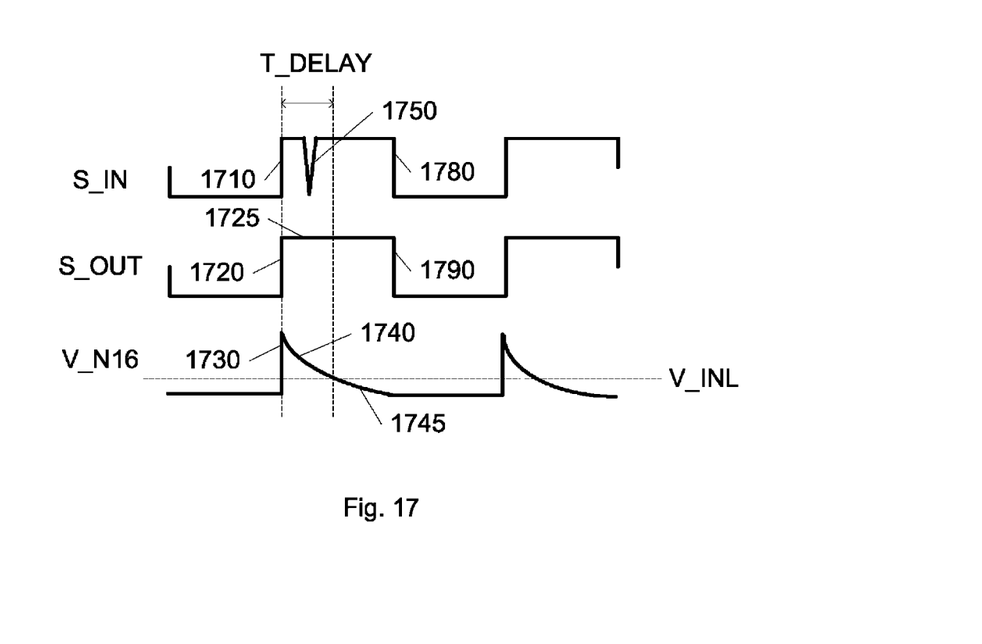

Reference is now made to FIG. 17 depicting waveform diagrams demonstrating the operation of deglitch circuit 1600 (see FIG. 16) according to an example of the present invention. FIG. 16 depicts waveform diagrams of input signal $S_{in}$, output signal $S_{out}$ and the voltage level V_N16 at node N16. After a falling edge 1710 of input signal $S_{in}$ occurs, output signal $S_{out}$ may change from logical '1' to logical '0' 1720, capacitor C16 may quickly charge 1730 through diode D16 and than gradually discharge 1740, with the rate of discharging depending on time constant $t_{RC}$ of RC low pass filter 1620. As long as V_N16 is above 1540 $V_{inH}$ of "or" gate 1610, V_N16 may be seen as logical '1', forcing logical '1' at output signal $S_{out}$ 1725 regardless of the value of input signal $S_{in}$. Thus a glitch 1750 appearing at input signal $S_{in}$ during that time period may be filtered out and not be present at output signal $S_{out}$. At some point in time, V_N16 may decrease below the level of $V_{inL}$ of "or" gate 1610, and thus V_N16 may be seen as a logical '0' 1745, enabling output signal $S_{out}$ to equal input signal $S_{in}$. Thus, a legitimate fall in $S_{in}$ 1780 may cause a fall in $S_{out}$ as well 1790. The time it takes V_N16 to decrease below the level of $V_{inL}$ after the occurrence of a rising edge of output signal $S_{out}$, also referred to as $t_{delay}$, may substantially define the guard time interval in which $S_{out}$ may be latched at logical '1', regardless of the value of input signal $S_{in}$, thus a glitch appearing at $S_{in}$ during the guard time interval may be prevented from passing to output signal $S_{out}$ and may thus be eliminated.

According to an example of the present invention, the guard time interval may be set to start after a desired transition in the input signal and end after no glitches are expected but before a desired transition in the input signal should occur. In case delay block 120 is implemented as RC low pass filter 410, the guard time interval may be substantially related to the time constant of the RC low pass filter and to $V_{inH}$ or $V_{inL}$ of the logical circuit. In case delay block 120 is implemented digitally, the guard time interval may substantially deepened on the logical function implementing the delay, as well as on the clock frequency in case a clock is used.

It should be noted that power on reset may be integrated in deglitch circuits according to an example of the invention. Capacitor C1 may force the initial state of the flip flop. Can be connected to Vcc or to GND to get any desired initial state. The propagation delay of deglitch circuits according to an example of the invention may be relatively low. Only the propagation delay of one to two gates participates in the overall delay from $S_{in}$ to $S_{out}$. For example, the overall propagation delay from $S_{in}$ to $S_{out}$ in deglitch circuit 400 may substantially equal the propagation delay of "And" gate 440. $S_{out}$ may be delayed for example, by RC low pass filter 410, however is delay may not be in the signal path and thus may not contribute to the overall propagation delay.

In examples of the present invention in which delay block 120 includes a LPF such as an RC low pass filter 410 presented in FIGS. 4, 6, 8 and 9, the voltage level present in an input pin of logic circuit 110 may remain between $V_{inL}$ and $V_{inH}$ for a transient time interval that is long relatively to digital circuits. As C1 charges or discharges, $V_c$ may have a voltage level that is above $V_{inL}$ and below $V_{inH}$ of the logical component connected to it. While $V_c$ is above $V_{inL}$ and below $V_{inH}$, the output of the logic component may be undefined and may have multiple transitions due to, for example, noise. As noted before, in order to avoid undefined input level at the input of the digital component connected to node N1, a Schmitt-trigger device may be used. However, since $V_c$ may be above $V_{inL}$ and below $V_{inH}$ outside the guard time interval, in time periods in which no glitches are present at input signal $S_{in}$, these multiple transitions may not interfere with the proper logical operation of the circuit. For example, in deglitch circuit 400, after falling edge 510, $V_c$ may decrease to below $V_{inH}$ only after the guard time interval have passed, and thus during the time interval in which $V_c$ is be above $V_{inL}$ and below $V_{inH}$, input signal $S_{in}$ may be stable at logical '0'. Since a logical '0' at one input of an "and" gate forces the output of the "and" gate to equal logical '0', $S_{out}$ may equal logical '0' and voltage transactions at $S_{inv}$ or $S_{or}$ may not be present at output signal $S_{out}$. As $V_c$ increases above $V_{inL}$ and below $V_{inH}$ after rising edge 580, $S_{out}$ may equal logical '1' thus forcing $S_{or}$ to equal logical '1', regardless of voltage transactions that may occur at $S_{inv}$ during that time period. Similar analysis may be repeated for other deglitch circuits according to an example of the present invention. Experiments made with implementation of deglitch circuits according to an example of the present invention have shown that the circuit worked using logical gates that did not have Schmitt-trigger inputs, for instance 74HCT00.

A deglitch circuit according to an example of the present invention may perform voltage level conversions between input signal $S_{in}$ and output signal $S_{out}$. For example, 5V inputs may be converted to 3.3V signaling levels, For example, by using chips 74HC132 or 74HC00 powered at 3.3V. 3.3V inputs may be converted to 5V signaling levels, for example, by using chips 74HCT132 or 74HCT00 powered at 5V.

A deglitch circuit according to an example of the present invention may be very reliable since filtering of glitches may depend on the timing of the glitch and substantially not on the energy and duration or number of glitches.

A deglitch circuit according to an example of the present invention may have low component count. Examples of the present invention may be implemented substantially using a resistor, capacitor and three gates as in deglitch circuits 400, 600 and 800 or a resistor, capacitor a flip flop and a gate as in deglitch circuit 900. In addition, examples of the present invention may be implemented within an ASIC or an FPGA, eliminating the need to add any other components to printed circuit boards (PCBs).

It should be understood that examples of the present invention may be used in a variety of applications. Although the present invention is not limited in this respect, the circuits and techniques disclosed herein may be used in many PCBs and the like. Examples of the present invention may implemented using discrete components, as an input buffer to ASICs and Field-programmable Gate Arrays (FPGAs) or in any other applicable form. Examples of the present invention may be implemented using hardware description languages such as VHDL or Verilog.

Aspects of the invention are described hereinabove with reference to flowcharts and/or block diagrams depicting methods, systems and computer program products according to examples of the invention.

What is claimed is:

1. A method for deglitching an input signal, the method comprising:
    delaying an output signal to generate a delayed signal, the delayed signal determining a guard time interval following a desired transition in the input signal; and
    using a logic circuit to keep the output signal unchanged during the guard time interval, and to allow the output signal to equal the input signal outside the guard time interval, based on a value of the delayed signal;
    wherein delaying the output signal comprises low pass filtering the output signal.

2. The method of claim 1 wherein low pass filtering the output signal is done using a low pass filter comprising a resistor and a capacitor connected in series and coupled to the output signal.

3. The method of claim 1, wherein delaying the output signal comprises digitally delaying the output signal.

4. A deglitch circuit comprising:
    a delay block to generate a delayed signal by delaying an output signal, the delayed signal determining a guard time interval following a desired transition in an input signal; and
    logic circuit to keep the output signal unchanged during the guard time interval, and to allow the output signal to equal the input signal outside the guard time interval, based on a value of the delayed signal;
    wherein the delay block comprises a low pass filter coupled to the output signal.

5. The deglitch circuit of claim 4, wherein the low pass filter comprising a resistor and a capacitor connected in series.

6. The deglitch circuit of claim 4, wherein the delay block comprises digital logic elements.

7. A deglitch circuit comprising:
    a delay block to generate a delayed signal by delaying an output signal, the delayed signal determining a guard time interval following a desired transition in an input signal; and
    logic circuit to keep the output signal unchanged during the guard time interval, and to allow the output signal to equal the input signal outside the guard time interval, based on a value of the delayed signal;
    wherein the logic circuit comprises:
        an inverter receiving the delayed signal;
        an "or" gate receiving the output of the inverter and the output signal; and
        an "and" gate receiving the output of the "or" gate and the input signal,
        wherein the output signal is the output of the "and" gate.

8. A deglitch circuit comprising:
    a delay block to generate a delayed signal by delaying an output signal, the delayed signal determining a guard time interval following a desired transition in an input signal; and
    logic circuit to keep the output signal unchanged during the guard time interval, and to allow the output signal to equal the input signal outside the guard time interval, based on a value of the delayed signal;
    ,wherein the logic circuit comprises:
        an inverter receiving the delayed signal;
        an "and" gate receiving the output of the inverter and the output signal; and
        an "or" gate receiving the output of the "and" gate and the input signal,
        wherein the output signal is the output of the "or" gate.

9. A deglitch circuit comprising:
    a delay block to generate a delayed signal by delaying an output signal, the delayed signal determining a guard time interval following a desired transition in an input signal; and
    logic circuit to keep the output signal unchanged during the guard time interval, and to allow the output signal to equal the input signal outside the guard time interval, based on a value of the delayed signal;
    wherein the logic circuit comprises:
        a first "Nand" gate receiving the delayed signal;
        a second "Nand" gate receiving the output of the first "Nand" gate and the input signal; and
        a third "Nand" gate receiving the output of the second "Nand" gate,
        wherein the first "Nand" gate also receiving the output of the second "Nand" gate, and wherein the output signal is the output of the third "Nand" gate.

10. A deglitch circuit comprising:
    a delay block to generate a delayed signal by delaying an output signal, the delayed signal determining a guard time interval following a desired transition in an input signal; and
    logic circuit to keep the output signal unchanged during the guard time interval, and to allow the output signal to equal the input signal outside the guard time interval, based on a value of the delayed signal;
    wherein the logic circuit comprises:
        an active low set-reset ($\overline{SR}$) latch receiving the delayed signal at the reset ($\overline{R}$) input and the input signal at the set ($\overline{S}$) input; and
        an inverter receiving the Q output of the $\overline{SR}$ latch;
        wherein the output signal is the output of the inverter.

11. A deglitch circuit comprising:
a delay block to generate a delayed signal by delaying an output signal, the delayed signal determining a guard time interval following a desired transition in an input signal; and
logic circuit to keep the output signal unchanged during the guard time interval, and to allow the output signal to equal the input signal outside the guard time interval, based on a value of the delayed signal;
wherein the logic circuit comprises:
an inverter receiving the delayed signal;
an "or" gate receiving the output of the inverter and the output signal; and
a gated data (D) latch receiving the output of the "or" gate at an enable (E) input and the input signal at a data (D) input,
wherein the output signal is the output (Q) of the gated D latch.

12. A deglitch circuit comprising:
a delay block to generate a delayed signal by delaying an output signal, the delayed signal determining a guard time interval following a desired transition in an input signal; and
logic circuit to keep the output signal unchanged during the guard time interval, and to allow the output signal to equal the input signal outside the guard time interval, based on a value of the delayed signal;
wherein:
the delay block comprises:
a first inverter receiving the output signal;
a counter receiving the output of the first inverter at the reset input and a clock signal as the clock input; and
a second inverter, wherein an input of the second inverter is coupled to an N'th order bit of the counter (QN) and the output of the second inverter is coupled to an enable (CE) input of counter;
and the logic block comprises
a component selectable from a list comprising:
an "and" gate receiving the N'th order bit of the counter and the input signal wherein the output signal is the output of the "and" gate, and
a gated data (D) latch receiving the N'th order bit of the counter at an enable input and the input signal at the data input wherein the output signal is the Q output of the gated D latch.

\* \* \* \* \*

UNITED STATES PATENT AND TRADEMARK OFFICE
CERTIFICATE OF CORRECTION

PATENT NO. : 8,487,647 B2
APPLICATION NO. : 13/231475
DATED : July 16, 2013
INVENTOR(S) : Juan Luis Lopez Rodriguez et al.

It is certified that error appears in the above-identified patent and that said Letters Patent is hereby corrected as shown below:

In the Claims

In column 14, line 27, in Claim 8, delete ",wherein" and insert -- wherein --, therefor.

Signed and Sealed this
Fifteenth Day of October, 2013

Teresa Stanek Rea
*Deputy Director of the United States Patent and Trademark Office*